(12) United States Patent
Pu et al.

(10) Patent No.: US 11,320,746 B1
(45) Date of Patent: May 3, 2022

(54) METHOD AND SYSTEM FOR MANUFACTURING INTEGRATED CIRCUIT

(71) Applicant: KLA Corporation, Milpitas, CA (US)

(72) Inventors: Haifeng Pu, Shanghai (CN); Ningqi Zhu, Shanghai (CN); Shengyuan Zhong, Shanghai (CN)

(*) Notice: Subject to any disclaimer, the term of this patent is extended or adjusted under 35 U.S.C. 154(b) by 0 days.

(21) Appl. No.: 17/168,632

(22) Filed: Feb. 5, 2021

(30) Foreign Application Priority Data

Dec. 30, 2020 (CN) .......................... 202011612883.3

(51) Int. Cl.
*G03F 9/00* (2006.01)
*G03F 7/20* (2006.01)
*H01L 27/02* (2006.01)

(52) U.S. Cl.
CPC .......... *G03F 7/70633* (2013.01); *G03F 7/705* (2013.01); *G03F 9/7076* (2013.01); *H01L 27/0274* (2013.01)

(58) Field of Classification Search
CPC .... G03F 7/70633; G03F 7/705; G03F 9/7076; H01L 27/0274
See application file for complete search history.

(56) References Cited

U.S. PATENT DOCUMENTS

| | | | |
|---|---|---|---|
| 2004/0233439 A1 | 11/2004 | Mieher et al. | |
| 2012/0127447 A1 | 5/2012 | Yang et al. | |
| 2014/0212817 A1 | 7/2014 | Habets | |
| 2018/0330999 A1* | 11/2018 | Lee | H01L 22/12 |

FOREIGN PATENT DOCUMENTS

| | | |
|---|---|---|
| EP | 2620976 A1 | 7/2013 |
| WO | 2017200159 A1 | 11/2017 |

OTHER PUBLICATIONS

WIPO, ISR for International Application No. PCT/US2021/027860, Sep. 27, 2021.

* cited by examiner

*Primary Examiner* — Peter B Kim
(74) *Attorney, Agent, or Firm* — Hodgson Russ LLP

(57) ABSTRACT

The method for manufacturing an integrated circuit includes: obtaining measurement data according to a first group of overlay marks on a first wafer, where the first group of overlay marks are disposed in a first region on the first wafer; obtaining a first parameter set according to a first model and the measurement data; and projecting the first parameter set into a second region on a second wafer to obtain simulated compensation data, where the second region includes a second group of overlay marks whose quantity is greater than that of the first group of overlay marks.

20 Claims, 14 Drawing Sheets

METHOD AND SYSTEM FOR MANUFACTURING INTEGRATED CIRCUIT

CROSS-REFERENCE TO RELATED APPLICATIONS

This application claims priority to Chinese Patent Application No. 202011612883.3 filed Dec. 30, 2020, the disclosure of which is hereby incorporated by reference.

FIELD OF THE INVENTION

The present invention generally relates to the field of semiconductor technologies, and more specifically, to a method and system for manufacturing an integrated circuit.

BACKGROUND OF THE INVENTION

Photolithography is a key process in the field of integrated circuit manufacturing. The process quality of photolithography directly affects indicators such as the yield, reliability, chip performance, and service life of integrated circuits. Improvements in the process quality of photolithography are closely associated with the stability of these indicators.

One type of photolithography is referred to as a photolithographic method. In the method, a photomask is illuminated by light such as ultraviolet light to transfer a pattern on the photomask to a photoresist on a wafer by exposure. The photoresist includes one or more components that undergo chemical transformation during exposure to ultraviolet radiation. Therefore, property changes that occur in the photoresist allow selective removal of an exposed part or an unexposed part of the photoresist. In this way, through photolithography, the pattern from the photomask may be transferred to the photoresist, and the photoresist is then selectively removed to expose the pattern. In addition, the foregoing steps may be repeated to implement photolithography that superimposes a plurality of pattern layers.

With the continuous innovation of semiconductor process technologies, how to control overlay offsets between a plurality of pattern layers already becomes a key factor for the yield of integrated circuits. How to reduce overlay offsets already becomes one of the major challenges in the semiconductor industry. In another aspect, due to the limitation of photomask sizes, a stitching technology is widely adopted in the manufacturing of charge-coupled devices (CCD) and complementary metal-oxide-semiconductor (CMOS) image sensors (CIS). How to control stitching offsets is another challenge.

An anamorphic lens is introduced into a high-numerical aperture extreme ultraviolet (EUV) photolithography technology, to provide a pattern layer with a higher resolution. In this technology, a pattern on a photomask needs to be stretched in a single direction for deformation (for example, in an X direction), and the deformed pattern on the photomask requires repeated exposure and a stitching technology is used to form a pattern layer on a wafer. The control of stitching offsets is also indispensable in the high-numerical aperture EUV photolithography technology. The calibration of overlay offsets and stitching offsets play an important role in photolithography.

SUMMARY OF THE INVENTION

One of the objectives of the embodiments of the present invention is to provide a method and system for manufacturing an integrated circuit, to calibrate stitching offsets and overlay offsets, thereby effectively reducing stitching offsets and overlay offsets.

An embodiment of the present invention provides a method for manufacturing an integrated circuit, including: obtaining measurement data according to a first group of overlay marks on a first wafer, where the first group of overlay marks are disposed in a first region on the first wafer; obtaining a first parameter set according to a first model and the measurement data; and projecting the first parameter set into a second region on a second wafer to obtain simulated compensation data, where the second region includes a second group of overlay marks whose quantity is greater than the first group of overlay marks.

Another embodiment of the present invention provides a method for manufacturing an integrated circuit, including: defining a first subregion and a second subregion in a first region on a first wafer, where a first group of overlay marks are disposed in the first region; applying a first model to measurement data associated with the first group of overlay marks to obtain a first parameter set; and projecting the first parameter set into a second region that is on a second wafer and has the same layout as the first region to obtain simulated compensation data.

Still another embodiment of the present invention further provides a system for manufacturing an integrated circuit, including: a processor, a nonvolatile computer-readable medium storing computer executable instructions, and a handler. The nonvolatile computer-readable medium storing computer executable instructions is coupled to the processor. The handler is configured to support a wafer. The processor executes the computer executable instructions to implement the method for manufacturing an integrated circuit according to the foregoing embodiments on the wafer.

DETAILED DESCRIPTION

To better understand the spirit of the present invention, the present invention is further described below with reference to some preferred embodiments of the present invention.

Hereinafter, various embodiments of the present invention will be described in detail. Although specific implementations are discussed, it should be understood that these implementations are used for description. It is apparent to a person skilled in the art that other members and configurations may be used without departing from the spirit and protection scope of the present invention.

Figure 1:
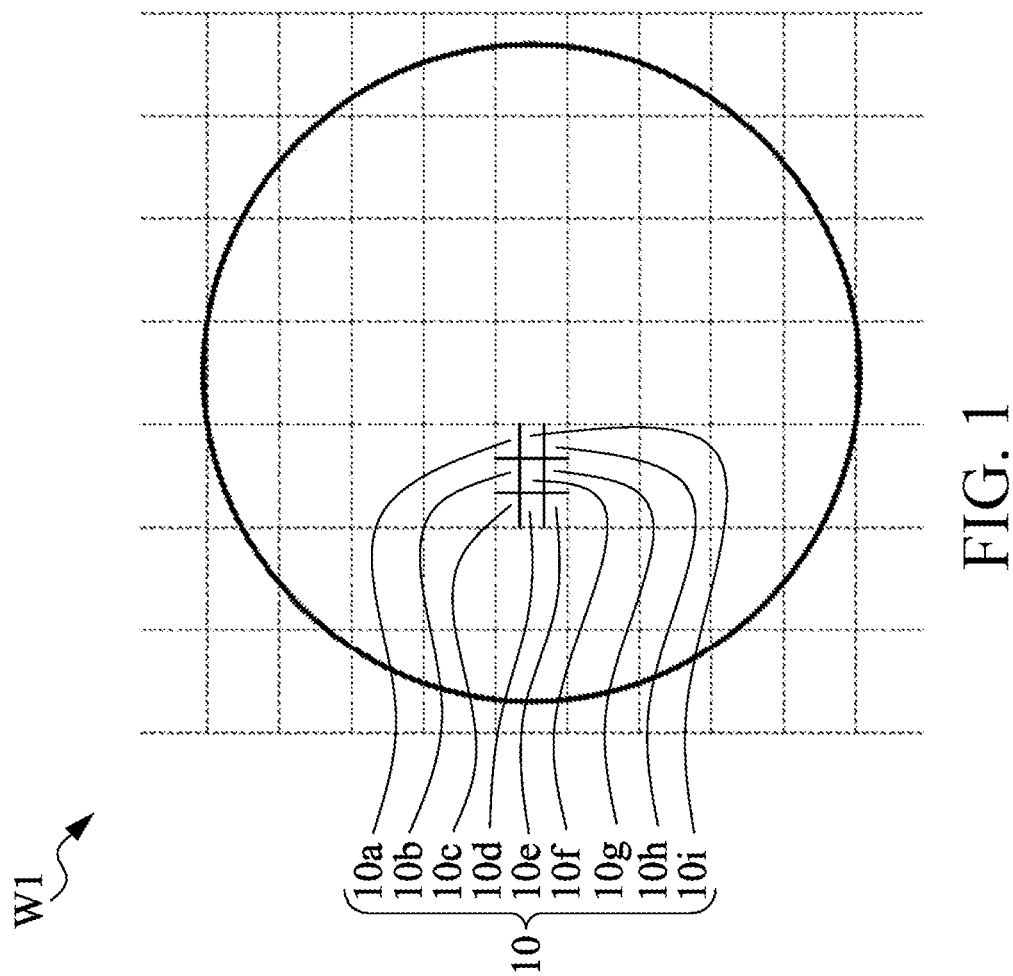
FIG. 1 is a schematic diagram of a wafer according to an embodiment of the present invention.

FIG. 1 is a schematic diagram of a wafer according to an embodiment of the present invention.

FIG. 1 is a schematic diagram of a wafer W1. The wafer W1 may include a plurality of regions 10. Each region 10 may include one complete semiconductor device, for example, a chip.

Devices in each region 10 on the wafer W1 may be manufactured by a semiconductor machine implementing a plurality of working procedures (including, but not limited to, deposition, etching, exposure, and development) on a substrate of the wafer. Each working procedure implemented by the semiconductor machine may form a plurality of layers of microstructure on the substrate, to eventually form devices that need to be manufactured.

As manufactured semiconductor devices have different areas, the region 10 may exceed the size limitation of each working procedure implemented by the semiconductor machine. Therefore, in some embodiments, the semiconductor machine may define a plurality of subregions in the region 10. Working procedures are individually implemented in the subregions in the region 10, to eventually complete the devices that need to be manufactured in the region 10.

In some embodiments, the region 10 may include subregions 10a, 10b, 10c, 10d, 10e, 10f, 10g, 10h, and 10i. In some other embodiments of the present invention, the quantity of subregions can be determined according to an actual requirement. For example, the quantity of subregions can be greater than 9 or less than 9.

Figure 2A:
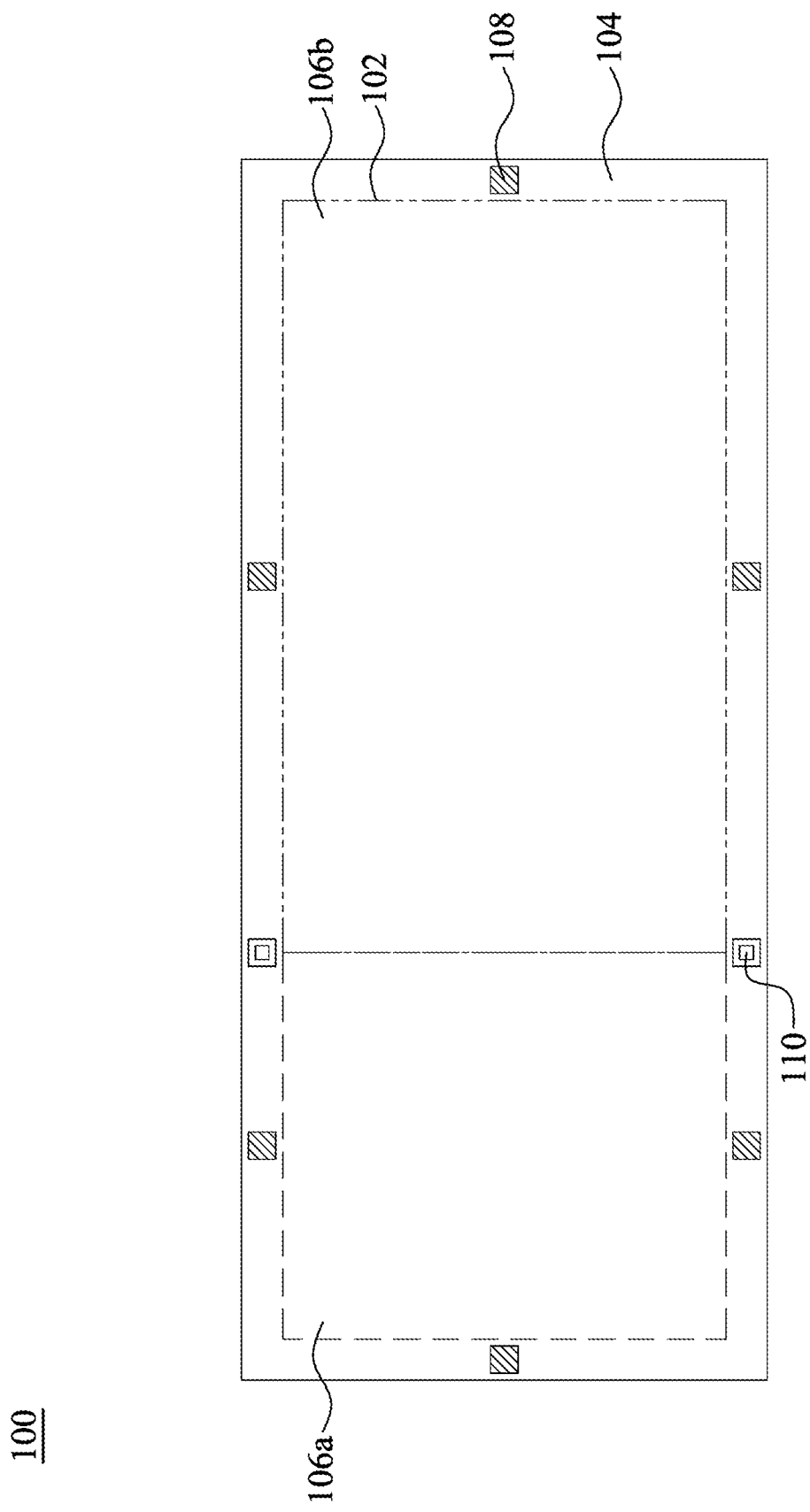
FIG. 2(a) is a schematic diagram of a region on a first wafer according to an embodiment of the present invention.

FIG. 2(a) is a schematic diagram of a region on a first wafer according to an embodiment of the present invention. As shown in FIG. 2(a), a region 100 is divided into a central region 102 and a circumferential region 104 located outside the central region 102.

The region 100 includes a first subregion 106a and a second subregion 106b. The first subregion 106a and the second subregion 106b are located in the central region 102. The second subregion 106b is adjacent to the first subregion 106a. In FIG. 2(a), the first subregion 106a and the second subregion 106b have different sizes. However, in some other embodiments of the present invention, the first subregion 106a and the second subregion 106b may have the same size.

A plurality of overlay marks 108 may be disposed in the circumferential region 104 of the region 100. The overlay marks 108 may be used for calibrating the position of a specific region on a current layer of the first wafer relative to the specific region on one or two previous layers. In FIG. 2(a), the quantity of the overlay marks 108 is 6. However, in some other embodiments of the present invention, the quantity of the overlay marks 108 can be determined according to an actual requirement. For example, the quantity of the overlay marks 108 may be greater than 6 or less than 6. In some other embodiments of the present invention, the overlay marks 108 may be disposed at other positions in the circumferential region 104. In addition, the overlay marks 108 are not limited to be disposed in the circumferential region 104. In some other embodiments of the present invention, the overlay marks 108 may be disposed at any positions in the region 100.

The size of the first subregion 106a may be less than or equal to an exposure size of the semiconductor machine (for example, an aligner). The size of the second subregion 106b may be less than or equal to the exposure size of the semiconductor machine (for example, the aligner). The size of the region 100 can be greater than the exposure size of the semiconductor machine (for example, the aligner). When the size of an electronic component that needs to be manufactured is greater than the exposure size of the semiconductor machine (for example, the aligner), the electronic component may be produced in a stitching manner. That is, different regions of the electronic component may be separately manufactured by using independent exposure procedures, to eventually form the complete electronic component.

When different regions of the electronic component are manufactured by using independent exposure procedures, stitching marks may be disposed on the wafer for calibration between different regions.

For example, a plurality of stitching marks 110 may be disposed in the circumferential region 104 between the first subregion 106a and the second subregion 106b. The stitching marks 110 may be used for calibrating the position of a current subregion relative to an adjacent subregion. In FIG. 2(a), the quantity of the stitching marks 110 is 2. However, in some other embodiments of the present invention, the quantity of the stitching marks 110 can be determined according to an actual requirement. For example, the quantity of the stitching marks 110 may be greater than 2 or less than 2. In addition, in FIG. 2(a), the stitching marks 110 are disposed in the circumferential region 104 between the first subregion 106a and the second subregion 106b. However, in some other embodiments of the present invention, the stitching marks 110 may be disposed in the central region 102 between the first subregion 106a and the second subregion 106b.

Figure 2B:
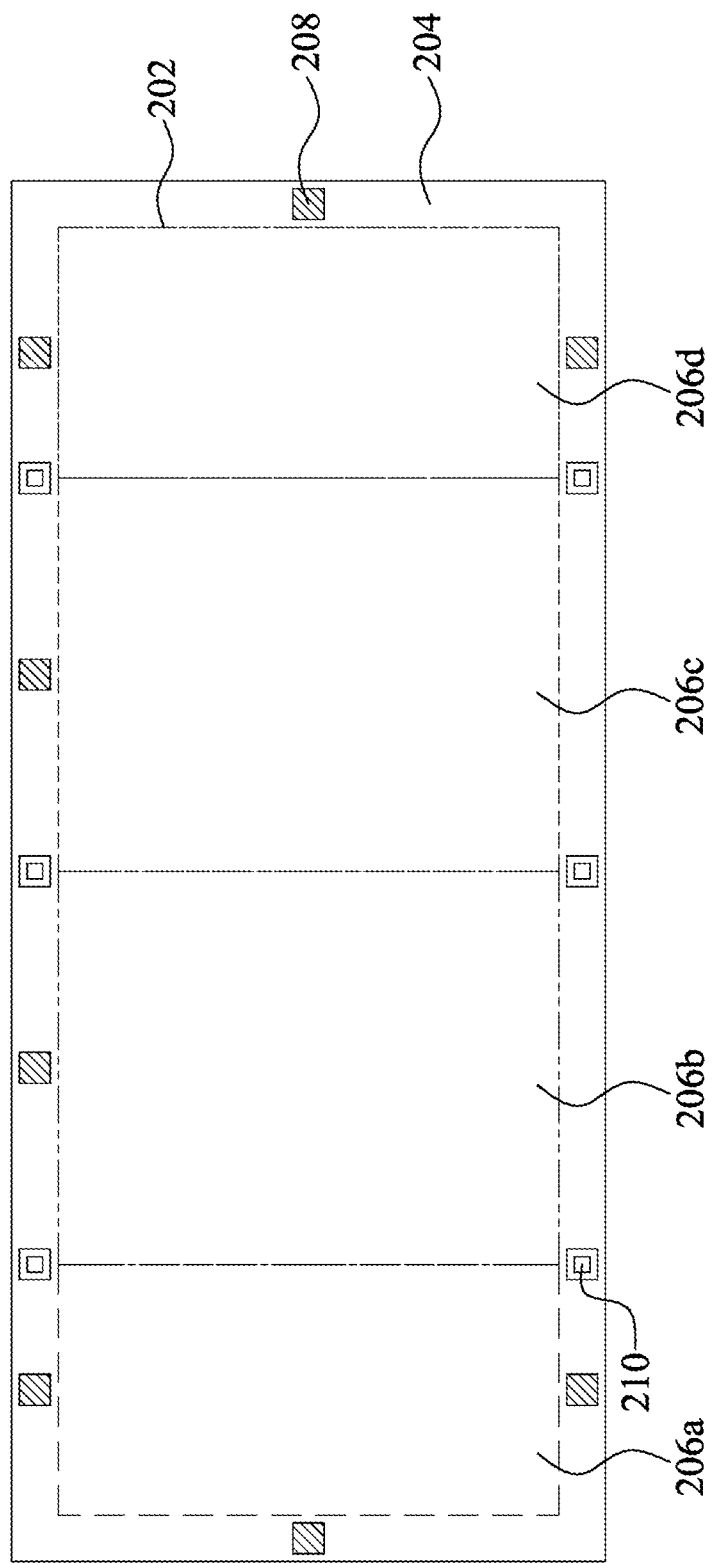
FIG. 2(b) is a schematic diagram of a region on a first wafer according to another embodiment of the present invention.

FIG. 2(b) is a schematic diagram of a region on a first wafer according to another embodiment of the present invention. As shown in FIG. 2(b), a region 200 is divided into a central region 202 and a circumferential region 204 located outside the central region 202.

The region 200 includes a first subregion 206a, a second subregion 206b, a third subregion 206c, and a fourth subregion 206d. The first subregion 206a, the second subregion 206b, the third subregion 206c, and the fourth subregion 206d are located in the central region 202. The second subregion 206b is located between the first subregion 206a and the third subregion 206c, and the third subregion 206c is located between the second subregion 206b and the fourth subregion 206d.

A plurality of overlay marks 208 are disposed in the circumferential region 204 of the region 200. The overlay marks 208 may be used for calibrating the position of a specific region on a current layer of the first wafer relative to the specific region on one or two previous layers. In FIG. 2(b), the quantity of the overlay marks 208 is 8. However, in some other embodiments of the present invention, the quantity of the overlay marks 208 can be determined according to an actual requirement. For example, the quantity of the overlay marks 208 may be greater than 8 or less than 8. In some other embodiments of the present invention, the overlay marks 208 may be disposed at other positions of the circumferential region 204. In addition, the overlay marks 208 are not limited to being disposed in the circumferential region 204. In some other embodiments of the present invention, the overlay marks 208 may be disposed at any positions in the region 200.

A plurality of stitching marks 210 may be separately disposed in the circumferential region 204 between the first subregion 206a and the second subregion 206b, the circumferential region 204 between the second subregion 206b and the third subregion 206c, and the circumferential region 204 between the third subregion 206c and the fourth subregion 206d. The stitching marks 210 may be used for calibrating the position of a current subregion relative to an adjacent subregion. In FIG. 2(b), the quantity of the stitching marks 110 is 6. However, in some other embodiments of the present invention, the quantity of the stitching marks 210 can be determined according to an actual requirement. For example, the quantity of the stitching marks 210 may be greater than 6 or less than 6. In addition, in FIG. 2(b), the stitching marks 210 are disposed at other positions between the first subregion 206a and the second subregion 206b, between the second subregion 206b and the third subregion 206c, and between the third subregion 206c and the fourth subregion 206d.

It should be understood that in some embodiments of the present invention, the region 100 or the region 200 may include subregions of different quantities, for example, more than three or five subregions. For example, in a specific embodiment of the present invention, the region 100 or the region 200 may be the region 10 shown in FIG. 1. A plurality of overlay marks are disposed in a circumferential region of the region 100 or the region 200. The plurality of stitching marks are disposed in circumferential regions between the subregions.

Figure 3:
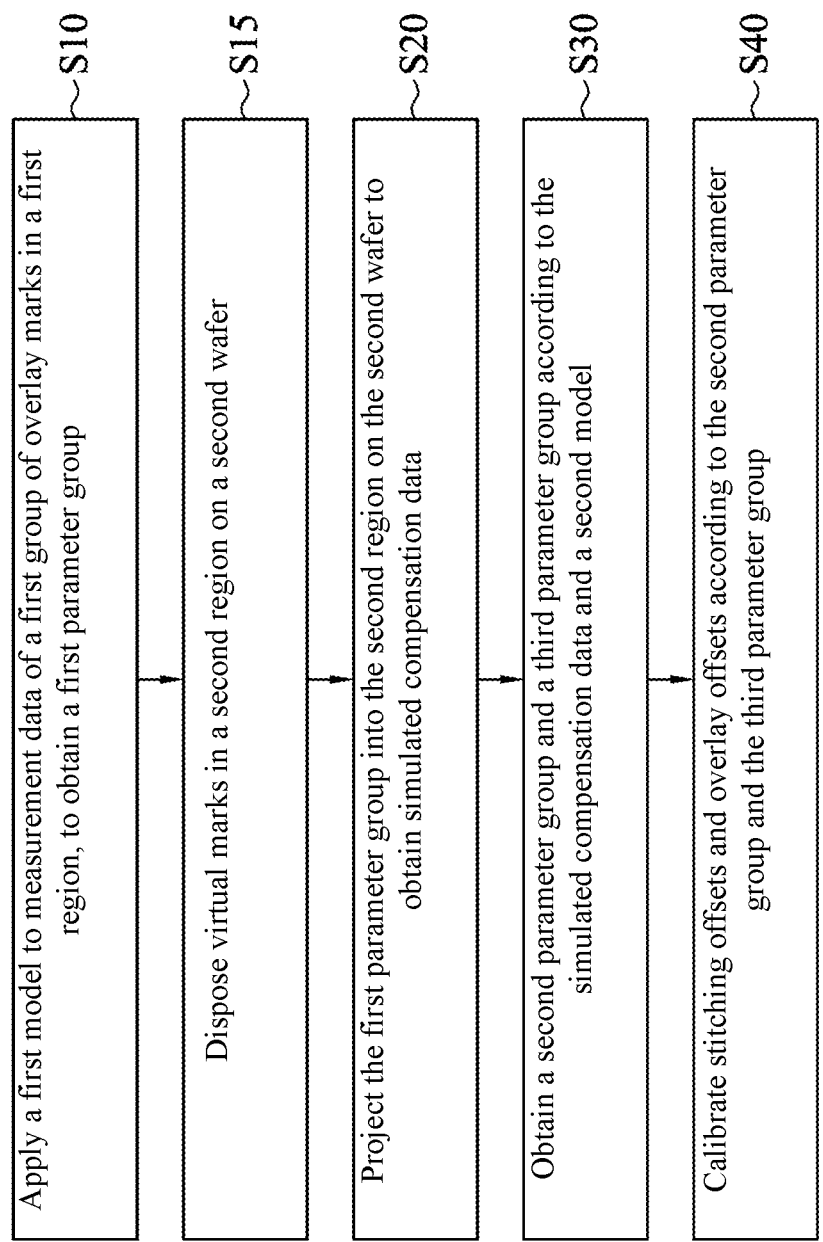
FIG. 3 is a flowchart of a method for manufacturing an integrated circuit according to an embodiment of the present invention.

FIG. 3 is a flowchart of a method for manufacturing an integrated circuit according to an embodiment of the present invention. Specifically, in an embodiment of the present invention, FIG. 3 is a flowchart of a method for manufacturing an integrated circuit including the region 100 shown in FIG. 2(a). In some embodiments, the method shown in FIG. 3 may be operated by a semiconductor manufacturing machine. In some embodiments, the method shown in FIG. 3 may be operated by the aligner.

As shown in FIG. 3, in the operation S10, a first model M1 is applied to measurement data of the overlay marks 108 in the region 100, to obtain a first parameter set Ds1.

Specifically, the region 100 including the first subregion 106a and the second subregion 106b is treated as a whole, the measurement data is obtained according to the overlay marks 108 in the region 100, and the first parameter set Ds1 is obtained according to the first model M1 and the measurement data.

The overlay marks 108 are disposed in the region 100. The measurement data indicates an offset amount associated with the overlay marks 108. In some embodiments of the present invention, the measurement data indicates actual offsets between the overlay marks 108 on a current layer of the region 100 and overlay marks on one or two previous layers of the first wafer in the region 100. These actual offsets indicate required compensation amounts between the current layer of the region 100 and one or two previous layers of the first wafer in the region 100.

The first model M1 may be a conventional overlay model, for example, a wafer level model or a region level model. The first parameter set Ds1 may be a group of parameters that enable the aligner to perform stitch calibration or overlay calibration in a region of the wafer.

In the operation S15, virtual overlay marks are disposed in a second region on a second wafer. In some embodiments, the virtual overlay marks may be evenly distributed in the second region. A user may set/select array coordinates, so that a plurality of virtual overlay marks are disposed on the second wafer. The user may, according to an actual requirement, set the quantity and positions of the virtual overlay marks in the second region on the second wafer. The quantity of the virtual overlay marks in the second region may be greater than the quantity of the overlay marks 108 in the region 100.

In the operation S20, the first parameter set Ds1 is projected into the second region on the second wafer to obtain simulated compensation data. Specifically, the first parameter set Ds1 from the operation S10 is projected into the second region that is on the second wafer and has the same layout as the region 100 on the first wafer, to obtain the simulated compensation data.

A projection operation in the present invention involves applying the first parameter set Ds1 to a plurality of overlay marks on the second wafer, to obtain simulated offsets associated with these overlay marks on the second wafer. The projection operation in this application is described in subsequent paragraphs in accordance with FIG. 4(a) and FIG. 4(b).

The simulated compensation data indicates simulated offsets between a second group of overlay marks in the second region on the current layer of the second wafer and the overlay marks in the second region on one or two previous layers of the second wafer. These simulated offsets indicate required compensation amounts between the second region on the current layer of the second wafer and one or two previous layers of the second region on the second wafer. The same layout indicates that the second region on the second wafer and the region 100 on the first wafer have the same size, and have subregions that are the same in quantity and size.

In some embodiments of the present invention, the second region on the second wafer may include a third subregion and a fourth subregion. The same layout further indicates the first subregion 106a on the first wafer and the third subregion on the second wafer have the same size, and the second subregion 106b on the first wafer and the fourth subregion on the second wafer have the same size.

In addition, in some embodiments of the present invention, the first subregion 106a on the first wafer is projected into the third subregion on the second wafer, and the second subregion 106b on the first wafer is projected into the fourth subregion on the second wafer. In some other embodiments of the present invention, the second group of overlay marks whose quantity is greater than that of the overlay marks 108 are disposed on the second region on the second wafer. For example, for the second region on the second wafer, the overlay marks may be disposed in a circumferential region of the second region, and the overlay marks may further be disposed in the third subregion and the fourth subregion. Therefore, the simulated compensation data further indicates compensation data for the overlay marks in the circumferential region of the second region and compensation data for the overlay marks in the third subregion and the fourth subregion.

In some other embodiments of the present invention, the second wafer is a virtual wafer. The second group of overlay marks includes a first overlay mark disposed in the third subregion (for example, a subregion 306a in FIG. 4(b)) on the second wafer and a second overlay mark disposed in the fourth subregion (for example, a subregion 306b in FIG. 4(b)) on the second wafer. The second wafer may be a virtual wafer defined in the semiconductor machine (for example, the aligner). The user may set the quantity and positions of virtual overlay marks in the third subregion and the fourth subregion according to an actual requirement.

In the operation S30, a second parameter set Ds2 and a third parameter set Ds3 are obtained according to the simulated compensation data and a second model M2. Specifically, the third subregion and the fourth subregion on the second wafer are treated as two independent subregions, and the second parameter set Ds2 associated with the third subregion and the third parameter set Ds3 associated with the fourth subregion are obtained according to the simulated compensation data from the operation S20 and the second model M2.

In some embodiments of the present invention, the second model M2 is an intra-region model. The second model M2 is compatible with the first model M1, to enable a residual between a first group of compensation data that is obtained according to the first model M1 and is associated with the first subregion 106a and a second group of compensation data that is obtained according to the second model M2 and is associated with the third subregion to be zero.

For example, after the first parameter set Ds1 associated with the region 100 is obtained according to the first model M1 in the operation S10, the compensation data associated with the region 100 may be obtained from the first parameter set Ds1. The compensation data includes the first group of compensation data associated with the first subregion 106a. The compensation data can be used to compensate offsets between a current layer of the region 100 and one or two previous layers of the region 100 on the wafer. The second group of compensation data associated with the third subregion is obtained according to the second model M2 in the operation S30. The residual between the first group of compensation data and the second group of compensation data is zero.

In some embodiments of the present invention, the second parameter set Ds2 and the third parameter set Ds3 respectively indicate compensation amounts that are mapped in the third subregion and the fourth subregion of the second region and are associated with the second group of overlay marks when the region 100 on the first wafer is simulated and overlaid on the second region on the second wafer.

In the operation S40, stitching offsets and overlay offsets are calibrated according to the second parameter set Ds2 and the third parameter set Ds3. Specifically, stitching offsets between the first subregion 106a and the second subregion 106b on the first wafer are calibrated according to the second parameter set Ds2 and the third parameter set Ds3 from the operation S30, and overlay offsets in the region 100 on the first wafer are calibrated according to the second parameter set Ds2 and the third parameter set Ds3.

Figure 4A:
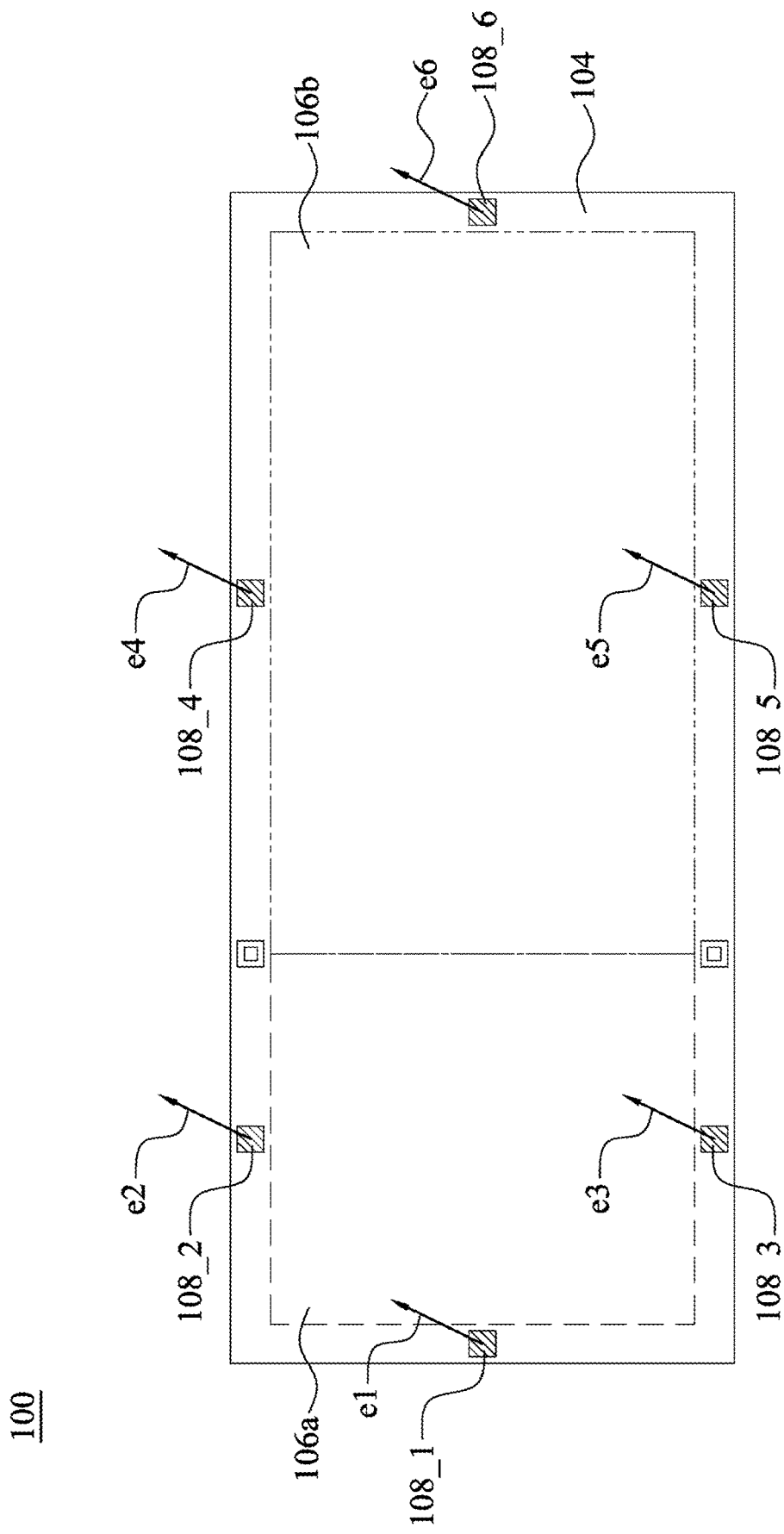
FIG. 4(a) and FIG. 4(b) are schematic diagrams of a projection operation according to an embodiment of the present invention.
Figure 4B:
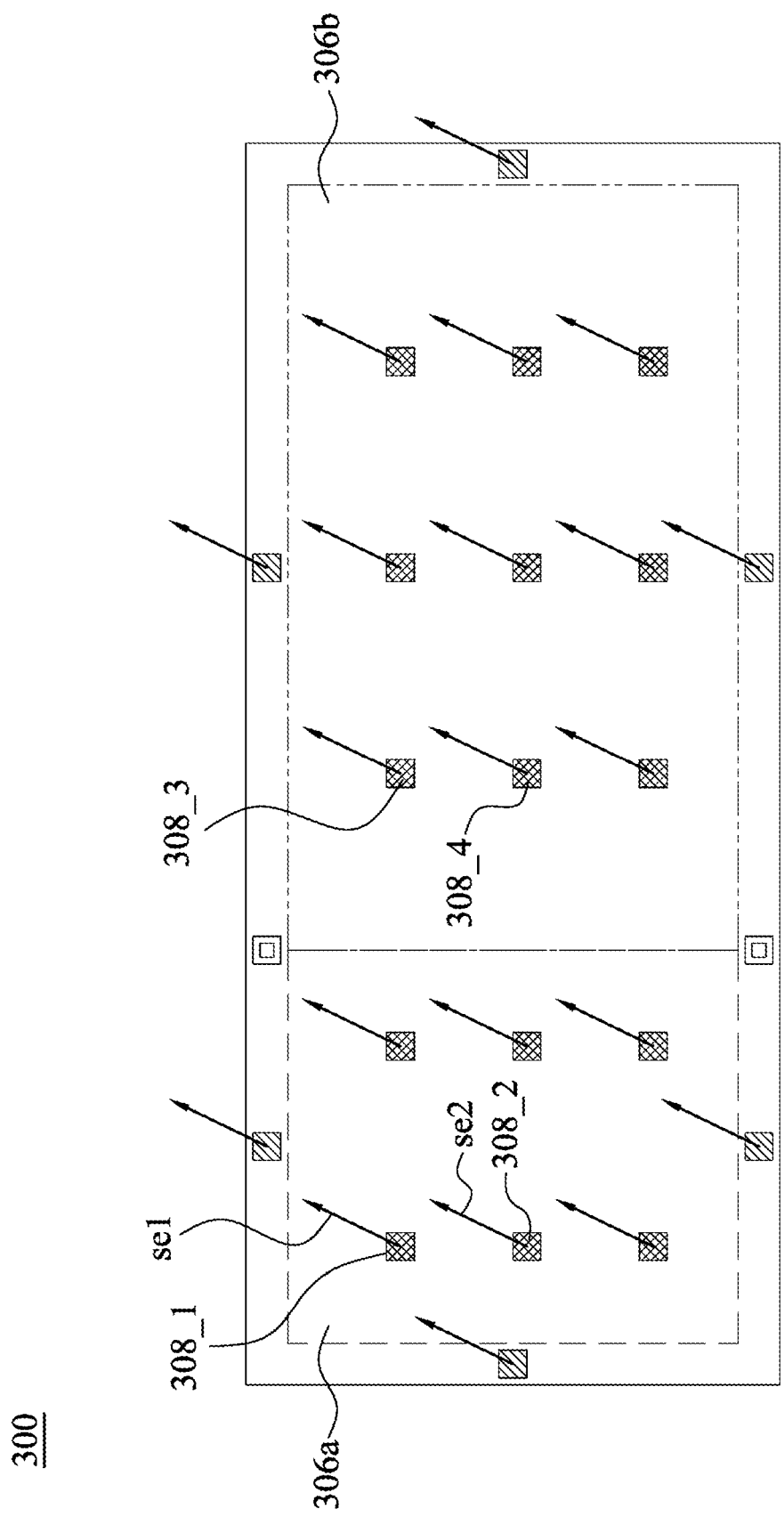

FIG. 4(a) and FIG. 4(b) are schematic diagrams of a projection operation according to an embodiment of the present invention.

FIG. 4(a) shows the region 100 on the first wafer. As shown in FIG. 4(a), a group of overlay marks 108_1, 108_2, 108_3, 108_4, 108_5, and 108_6 are disposed in the circumferential region 104 of the region 100. Measurement data associated with an overlay mark 108_1 is represented by a vector e1. Measurement data associated with an overlay mark 108_2 is represented by a vector e2. Measurement data associated with an overlay mark 108_3 is represented by a vector e3. Measurement data associated with an overlay mark 108_4 is represented by a vector e4. Measurement data associated with an overlay mark 108_5 is represented by a vector e5. Measurement data associated with an overlay mark 108_6 is represented by a vector e6.

The vector e1 may represent an offset between the current layer and one or two previous layers of the wafer at the overlay mark 108_1. The vector e2 may represent an offset between the current layer and one or two previous layers of the wafer at the overlay mark 108_2. Similarly, the vectors e3, e4, e5, and e6 may respectively represent offsets between the current layer and one or two previous layers of the wafer at the overlay marks 108_3, 108_4, 108_5, and 108_6.

In some embodiments, the vectors e1, e2, e3, e4, e5, and e6 may have the same magnitude or different magnitudes. In some embodiments, the vectors e1, e2, e3, e4, e5, and e6 may have the same direction or different directions.

The vectors e1, e2, e3, e4, e5, and e6 may correspond to the measurement data in the operation S10 in FIG. 3. In some embodiments, the vectors e1, e2, e3, e4, e5, and e6 may be applied to the first model M1 in the operation S10, so that the first parameter set Ds1 read by the semiconductor manufacturing machine (for example, the aligner) may be obtained. Compensation vectors at the overlay marks 108_1, 108_2, 108_3, 108_4, 108_5, and 108_6 may be determined by the first parameter set Ds1 obtained according to the vectors e1, e2, e3, e4, e5, and e6.

In some embodiments, according to different first models M1 selected, compensation vectors obtained for the overlay marks 108_1, 108_2, 108_3, 108_4, 108_5, and 108_6 can also be different. In some embodiments, the overlay marks 108_1, 108_2, and 108_3 around the subregion 106a may have the same magnitude and the same direction. In some embodiments, the overlay marks 108_1, 108_2, and 108_3 around the subregion 106a may have different magnitudes or directions.

In some embodiments, the overlay marks 108_4, 108_5, and 108_6 around the subregion 106b may have the same magnitude and the same direction. In some embodiments, the overlay marks 108_4, 108_5, and 108_6 around the subregion 106b may have different magnitudes or directions.

In some embodiments, the overlay marks around the subregion 106a and the overlay marks around the subregion 106b may have the same magnitude and the same direction. In some embodiments, the overlay marks around the subregion 106a and the overlay marks around the subregion 106b may have different magnitudes or directions.

FIG. 4(b) shows a region 300 on a virtual wafer. The region 300 includes a subregion 306a and a subregion 306b. The region 300 may have the same layout as the region 100. The region 300 may have the same size as the region 100. The subregion 306a may have the same layout as the subregion 106a. The subregion 306a may have the same size as the subregion 106a. The subregion 306b may have the same layout as the subregion 106b. The subregion 306b may have the same size as the subregion 106b.

The subregion 306a may include a plurality of virtual overlay marks (for example, 308_1 and 308_2). In some embodiments, the virtual overlay marks may be evenly distributed in the subregion 306a. Similarly, the subregion 306b may include a plurality of virtual overlay marks (for example, 308_3 and 308_4). In some embodiments, the virtual overlay marks may be evenly distributed in the subregion 306b. A user may set/select array coordinates, so that a plurality of virtual overlay marks are disposed on the virtual wafer. The user may set the quantity and positions of the virtual overlay marks in the subregion 306a and the subregion 306b according to an actual requirement.

Simulated compensation data associated with each virtual overlay mark may be obtained by using the first parameter set Ds1 obtained in the operation S10 in FIG. 3 in combination with the virtual overlay marks in the subregion 306a and the subregion 306b.

For example, a simulated offset set associated with a virtual overlay mark 308_1 may be obtained by using the first parameter set Ds1 and the virtual overlay mark 308_1. A simulated offset se2 associated with a virtual overlay mark 308_2 may be obtained by using the first parameter set Ds1 and the virtual overlay mark 308_2. The rest is deduced by analogy. A simulated offset associated with each virtual overlay mark in the subregion 306a and the subregion 306b may be obtained by using the first parameter set Ds1.

An operation of obtaining simulated offsets in the region 300 on the virtual wafer by using the first parameter set Ds1 and the plurality of virtual overlay marks is referred to as a projection operation in this application.

Figure 5:
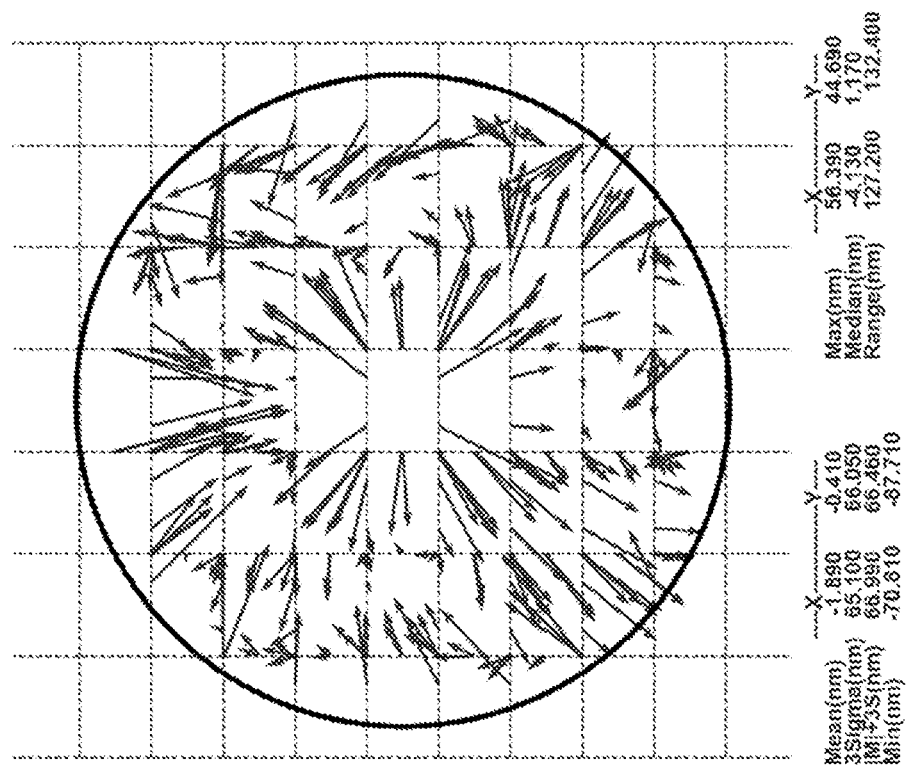
FIG. 5 is a vector diagram of overlay offsets in regions on a first wafer according to an embodiment of the present invention.

FIG. 5 is a vector diagram of overlay offsets in regions on a first wafer according to an embodiment of the present invention. In an embodiment of the present invention, the region 100 shown in FIG. 2(a) may be one of the regions shown in FIG. 5. The region 100 is used as an example. Offset values, for example, horizontal offset values X and vertical offset values Y, between the overlay marks 108 in the region 100 on the current layer of the first wafer and the overlay marks in a corresponding region on one or two previous layers of the first wafer, and offset directions of the horizontal offset values X and the vertical offset values Y are compared, so that a diagram of offset vectors that is based on the horizontal offset values X, the vertical offset values Y, and the offset directions may be obtained. These offset vectors indicate offset values and directions that require compensation in the region 100 on the current layer of the first wafer relative to the corresponding region on one or two previous layers.

Figure 6:
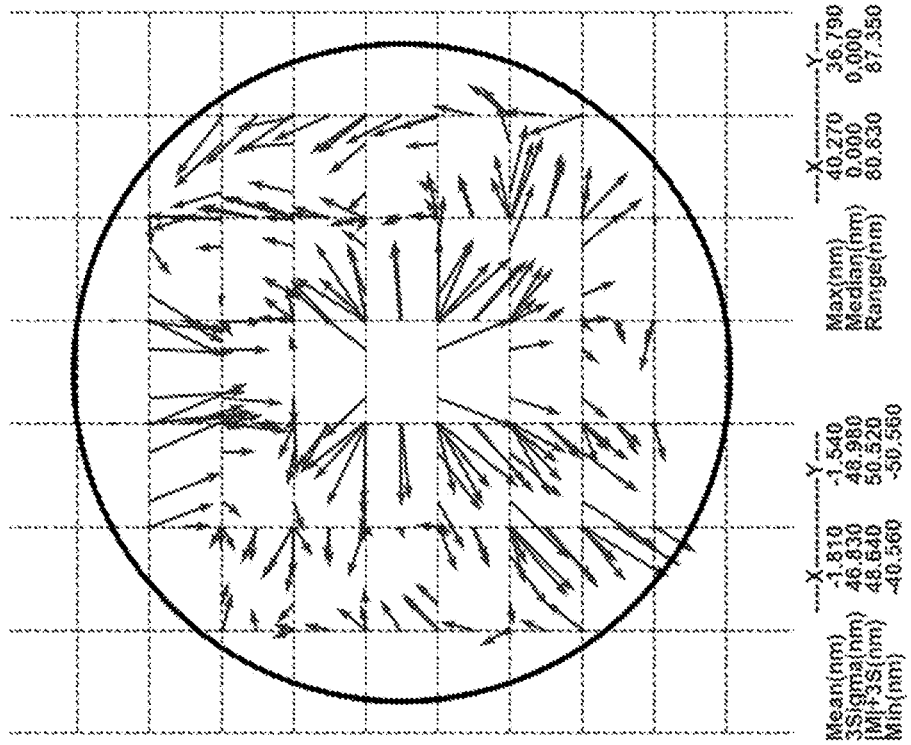
FIG. 6 is a diagram of compensation vectors of the vector diagram of overlay offsets shown in FIG. 5 obtained after an operation S10 in FIG. 3 is performed.

FIG. 6 shows a diagram of compensation vectors obtained based on the first parameter set Ds1 after the operation S10 shown in FIG. 3 is performed on the vector diagram of overlay offsets shown in FIG. 5. A compensation vector indicates an amount for compensating for the offset vector shown in FIG. 5, to achieve the alignment between the region 100 on a current layer of a wafer and a corresponding region on one or two previous layers of the wafer.

Specifically, offset values (that is, the measurement data) between the overlay marks 108 and corresponding overlay marks on one or two previous layers of the wafer are obtained according to the overlay marks 108 on the region 100. Next, the first model M1 is applied to the measurement data to obtain the first parameter set Ds1 that can be recognized and performed by the aligner. Subsequently, the aligner may obtain and display, according to the first parameter set Ds1, a diagram of compensation vectors required for the offsets of the overlay marks 108 on the region 100. It should be understood that with the presence of a measurement error or a machine error, the diagram of compensation vectors in FIG. 6 and the diagram of offset vectors in FIG. 5 are not completely identical.

Figure 7:
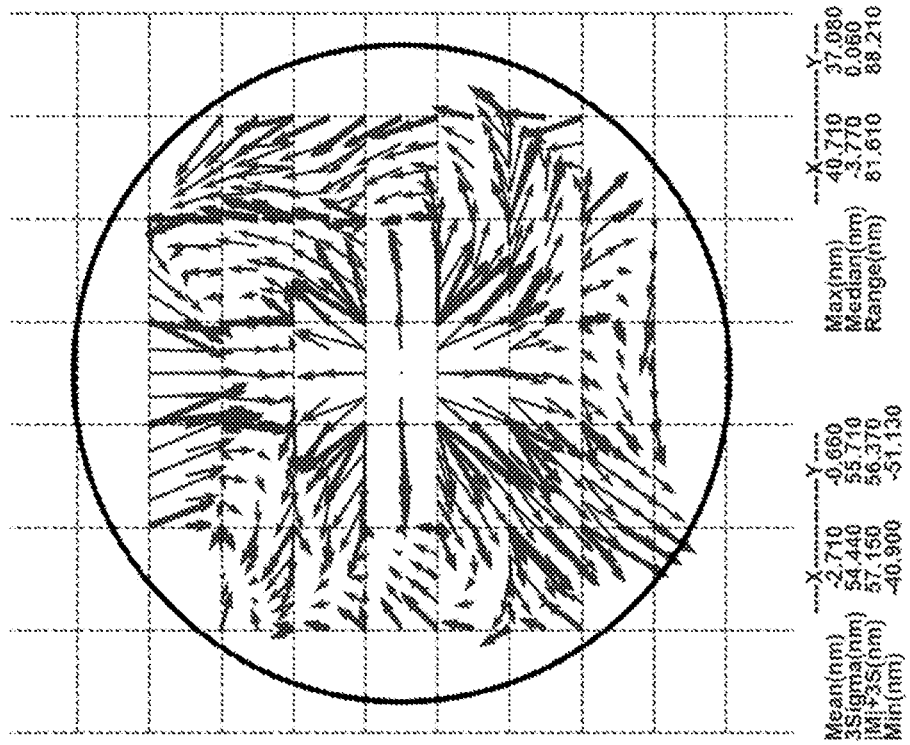
FIG. 7 is a diagram of compensation vectors of the diagram of compensation vectors in FIG. 6 after a projection operation S20 is performed.

FIG. 7 is a diagram of compensation vectors of the diagram of compensation vectors in FIG. 6 after a projection operation S20 is performed. In FIG. 7, data enhancement is performed on the compensation vector in FIG. 6. Specifically, the first parameter set Ds1 is projected into the second region (for example, the region 300 in FIG. 4(b)) on the second wafer, and the second region includes a second group of overlay marks whose quantity is greater than that of the overlay marks 108. In this way, a diagram of compensation vectors corresponding to the second group of overlay marks may be obtained. Because the quantity of the second group of overlay marks is greater than that of the overlay marks 108, the diagram of compensation vectors shown in FIG. 7 includes more compensation vector data, thereby implementing data enhancement.

Figure 8A:
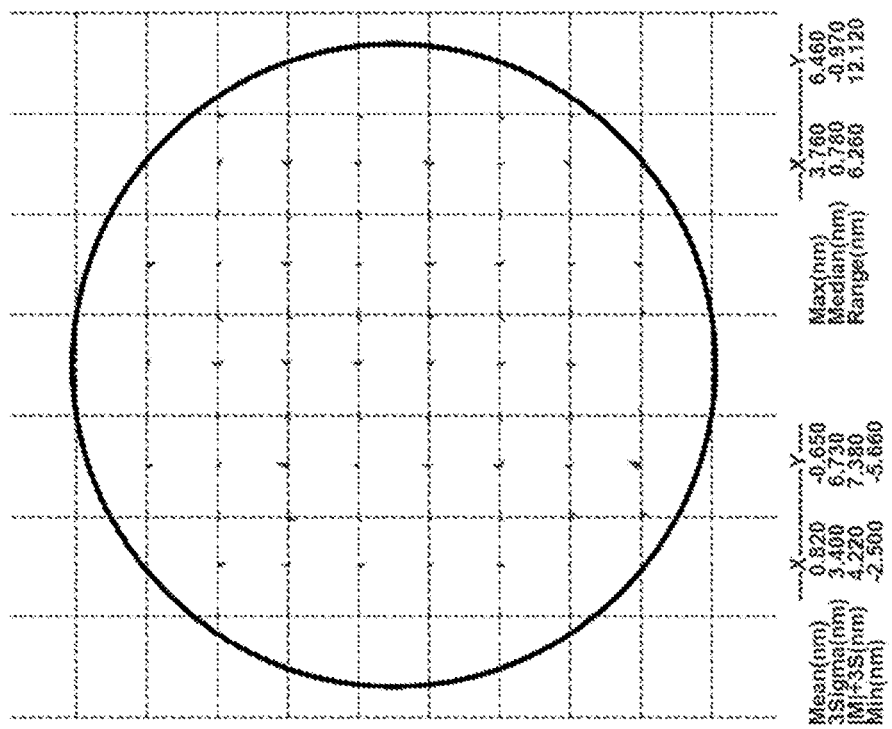
FIG. 8(a) is a diagram of offset vectors of overlay marks obtained after the method shown in FIG. 3 is performed.

FIG. 8(a) is a diagram of offset vectors of overlay marks obtained after the method shown in FIG. 3 is performed. Specifically, FIG. 8(a) is a diagram of the remaining offset vectors that require compensation after the diagram of compensation vectors shown in FIG. 7 is used for compensating the diagram of offset vectors shown in FIG. 5. As can be known from FIG. 8(a), the offset vector values of the overlay marks 108 in the region 100 are already very small. That is, after compensation, the offset values between the overlay marks 108 in the region 100 on the current layer of the wafer and overlay marks on one or two previous layers are already greatly reduced, thereby enormously reducing overlay offsets in the region 100.

Figure 8B:
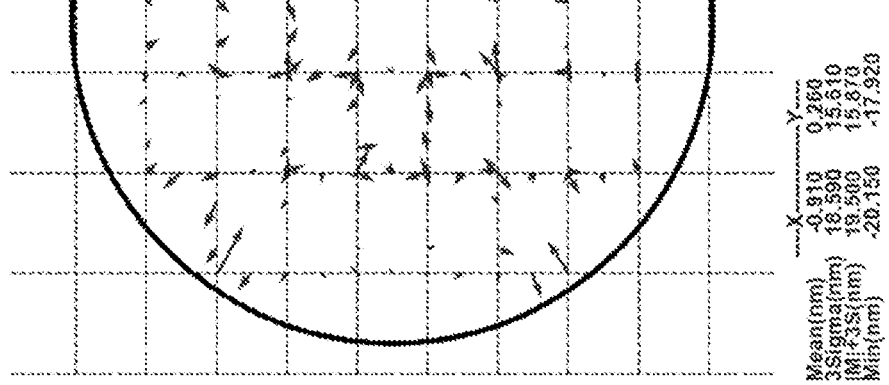
FIG. 8(b) is a diagram of offset vectors of stitching marks obtained after the method shown in FIG. 3 is performed.

FIG. 8(b) is a diagram of offset vectors of stitching marks obtained after the method shown in FIG. 3 is performed. As can be learned from FIG. 8(b), after compensation, the values of stitching offsets between subregions on the wafer are very small and can be nearly omittable. That is, the stitching offsets between subregions after compensation are also enormously reduced.

Figure 9A:
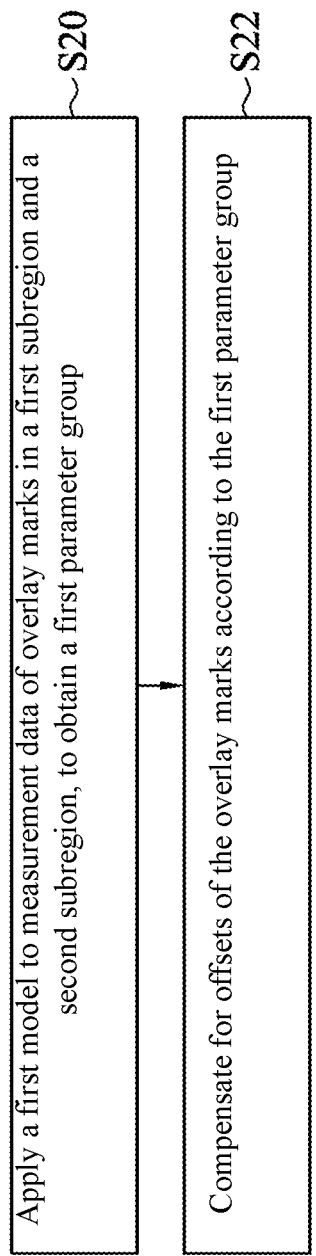
FIG. 9(a) is a flowchart of a method for manufacturing an integrated circuit according to a comparative embodiment of the present invention.

FIG. 9(a) is a flowchart of a method for manufacturing an integrated circuit according to a comparative embodiment of the present invention. FIG. 9(a) is a flowchart of the method for manufacturing an integrated circuit shown in FIG. 2(a), and it is only considered to compensate for offsets of overlay marks.

In the operation S20, the first model M1 is applied to the measurement data of the overlay marks 108 in the first subregion 106a and the second subregion 106b, to obtain a first parameter set Ds1'. Specifically, the first subregion 106a and the second subregion 106b are considered as two independent subregions, the offset values (that is, the measurement data) between the overlay marks 108 on the current layer of the wafer and the corresponding overlay marks on one or two previous layers of the wafer are obtained according to the overlay marks 108 in the first subregion 106a and the second subregion 106b, and the first model M1 is applied to the measurement data to obtain the first parameter set Ds1' that can be recognized and executed by the aligner.

In the operation S22, offsets of the overlay marks 108 are compensated for according to the first parameter set Ds1'. Specifically, the aligner compensates for the offsets on the overlay marks 108 on the current layer of the wafer in the first subregion 106a and the second subregion 106b according to the first parameter set Ds1'.

Figure 9B:
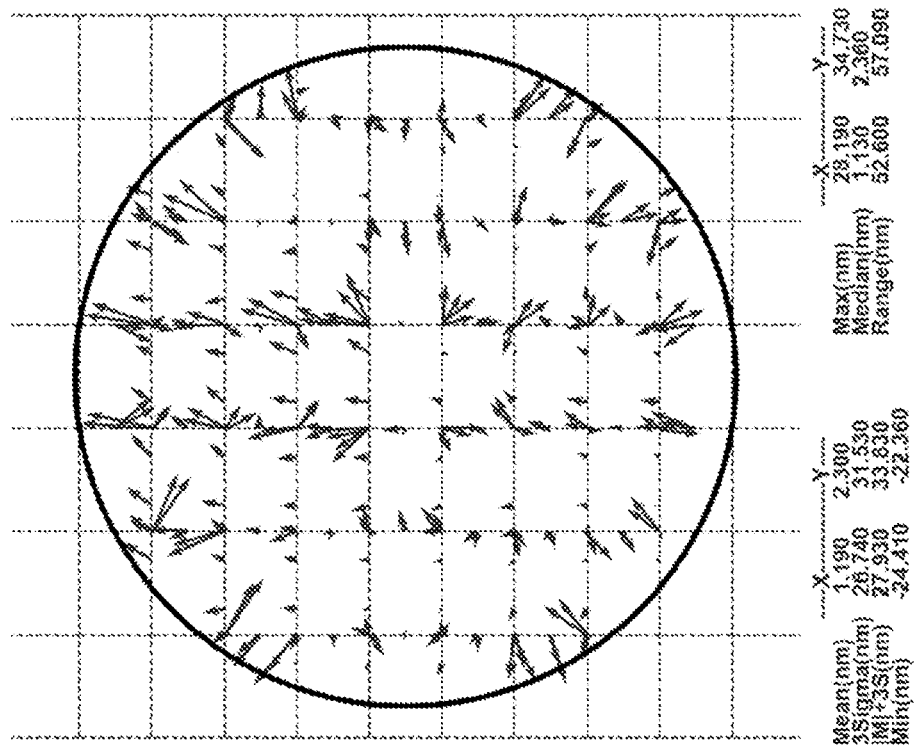
FIG. 9(b) is a diagram of offset vectors of overlay marks obtained after the method shown in FIG. 9(a) is performed.

FIG. 9(b) is a diagram of offset vectors of overlay marks obtained after the method shown in FIG. 9(a) is used. Specifically, FIG. 9(b) is a schematic diagram of the remaining offset vectors that require compensation after the method shown in FIG. 9(a) is used to compensate for the offsets of the overlay marks 108 in the first subregion 106a and the second subregion 106b. Compared with the diagram of offset vectors in FIG. 8(a), the offset vector values in the diagram of offset vectors shown in FIG. 9(b) are still relatively large.

Figure 9C:
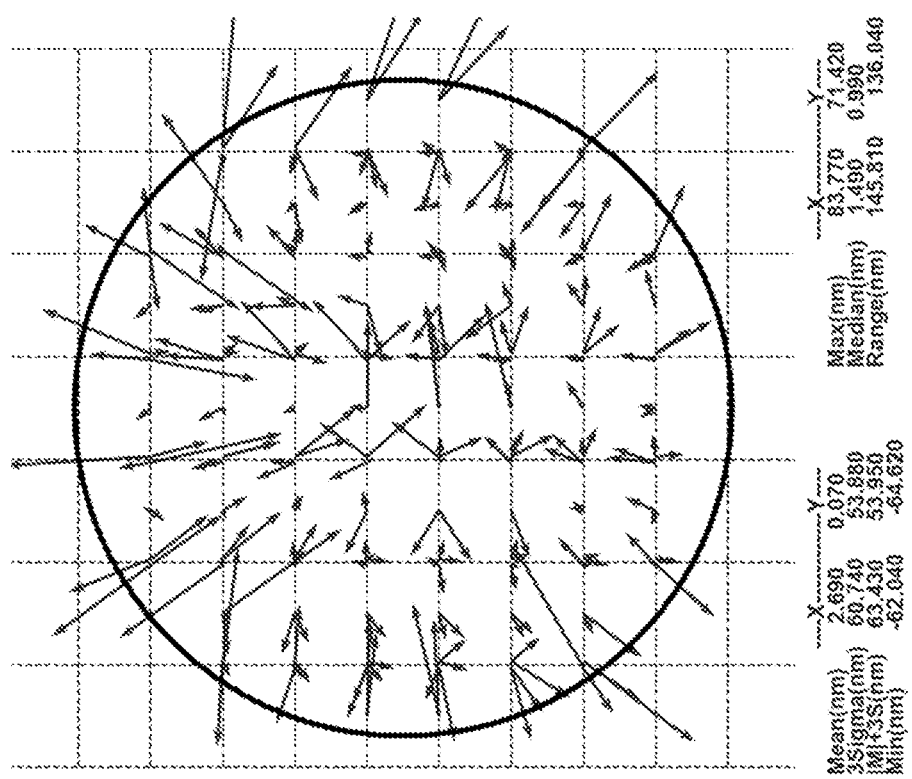
FIG. 9(c) is a diagram of offset vectors of stitching marks obtained after the method shown in FIG. 9(a) is performed.

FIG. 9(c) is a diagram of offset vectors of stitching marks obtained after the method shown in FIG. 9(a) is used. Specifically, FIG. 9(c) is a schematic diagram of the remaining offset value vectors that still require compensation after the first parameter set Ds1' obtained after the operation S20 shown in FIG. 9(a) is used to compensate for the values of stitching offsets. Compared with a diagram of offset vectors of the stitching mark shown in FIG. 8(b), the offset vector value shown in FIG. 9(c) is still very large, and is even greater than offset vector values of regions on the first wafer shown in FIG. 5 without stitching compensation.

Figure 10:
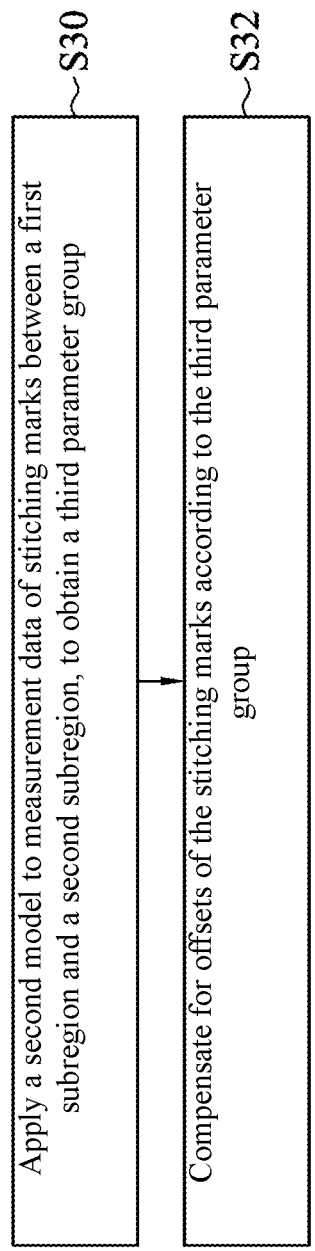
FIG. 10 is a flowchart of a method for manufacturing an integrated circuit according to a comparative embodiment of the present invention.

FIG. 10 is a flowchart of a method for manufacturing an integrated circuit according to a comparative embodiment of the present invention. FIG. 10 is a flowchart of the method for manufacturing an integrated circuit shown in FIG. 2(a), and it is only considered to compensate for the offsets of stitching marks.

In the operation S30, the second model M2 is applied to the measurement data of the stitching marks 110 between the first subregion 106a and the second subregion 106b, to obtain a third parameter set Ds3'. Specifically, the first subregion 106a and the second subregion 106b are considered as two independent subregions, and an offset value (that is, the measurement data) between a current subregion and an adjacent subregion is obtained according to the stitching marks 110 in the region 100, and the second model M2 is applied to the measurement data to obtain the third parameter set Ds3' that can be recognized and performed by the aligner.

In the operation S22, the offsets of the stitching marks 110 are compensated for according to the third parameter set Ds3'. Specifically, the aligner compensates for the offset values of the stitching marks 110 in the region 100 according to the third parameter set Ds3'.

Although this application does not provide a diagram of offset vectors obtained through tests by using the method in FIG. 10, similar to results obtained in FIG. 9(b) and FIG. 9(c), after the method in FIG. 10 is used to perform compensation, the remaining offset vector values that require compensation in stitching marks and overlay marks are still relatively large.

Calculation is separately performed in the diagram of offset vectors in FIG. 8(a), FIG. 8(b), FIG. 9(b), and FIG. 9(c), to obtain the remaining offset values that require compensation after compensation.

As can be known from Table 1, compared with FIG. 9(b), after the compensation in FIG. 8(a), the values of the remaining overlay offsets are reduced by 30% and 53% (30% in the horizontal direction, and 53% in the vertical direction). That is, compared with the method shown in FIG. 9(a), the method shown in FIG. 3 significantly reduces overlay offsets on the wafer.

In addition, compared with FIG. 9(c), after the compensation in FIG. 8(b), the values of the remaining stitching offsets are reduced by 93% and 86% (93% in the horizontal direction, and 86% in the vertical direction). That is, compared with the method shown in FIG. 10, the method shown in FIG. 3 significantly reduces stitching offsets on the wafer.

Therefore, the efficiency of compensating for overlay offsets and stitching offsets by using the method shown in FIG. 3 is much higher than that of the method shown in FIG. 9(a) and FIG. 10.

Figure 11:
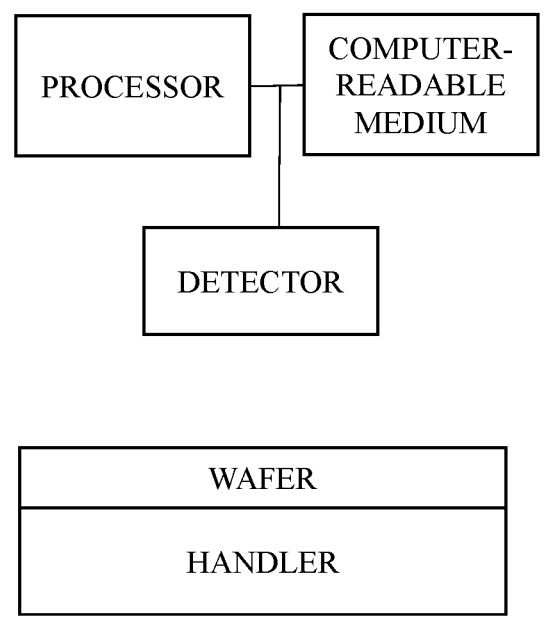
FIG. 11 is an exemplary system in accordance with the present disclosure.

In addition, some other embodiments of the present invention further provide a system for manufacturing an integrated circuit, such as that illustrated in FIG. 11. The system includes a processor, a nonvolatile computer-readable medium storing computer executable instructions, and a handler. The nonvolatile computer-readable medium storing computer executable instructions may be coupled to the processor. The handler may be configured to support a wafer. The processor may execute the computer executable instructions to implement the method for manufacturing an integrated circuit shown in FIG. 3, FIG. 9(a), and FIG. 10 on the wafer.

The processor may be any suitable processor known in the art, such as a parallel processor, and may be part of a personal computer system, image computer, mainframe computer system, workstation, network appliance, internet appliance, or other device. In some embodiments, various steps, functions, and/or operations of the system and the sub-systems therein and the methods disclosed herein are carried out by one or more of the following: electronic circuits, logic gates, multiplexers, programmable logic devices, ASICs, analog or digital controls/switches, microcontrollers, or computing systems. For instance, the various steps described throughout the present disclosure may be carried out by a single processor (or computer system) or, alternatively, multiple process (or multiple computer systems). Therefore, the above description should not be interpreted as a limitation on the present disclosure but merely an illustration.

The system may include a detector, which can use an optical beam or electron beam to image or otherwise measure features on a wafer.

In the present invention, a relationship between stitch and overlay is found out. That is, stitch is mainly determined by overlay calibration. A method for obtaining overlay calibration is proposed, to enable the method to reduce stitch at the

TABLE 1

|  |  | Remaining offset value obtained after the methods in FIG. 9(a) and FIG. 10 are used to perform compensation (unit: nanometer) | Remaining offset value obtained after the method in FIG. 3 is used to perform compensation (unit: nanometer) | Reduction rate |
| --- | --- | --- | --- | --- |
|  | X/Y (horizontal direction/vertical direction) | | | |
| Overlay | X | 27.9 | 19.5 | 30% |
|  | Y | 33.8 | 15.8 | 53% |
| Stitch | X | 63.4 | 4.2 | 93% |
|  | Y | 53.9 | 7.3 | 86% | same time. With the method for manufacturing an integrated circuit proposed in the present invention, both overlay offsets and stitching offsets can be significantly reduced.

It should be noted that the wording "an embodiment of the present invention" or a similar term throughout this specification, with reference to its purpose, is intended to point out that a specific feature, structure, or property described together with another embodiment is included in at least one embodiment and is not necessarily presented in all embodiments. Therefore, when the wording "an embodiment of the present invention" or a similar term correspondingly appears throughout this specification, it does not necessarily represent a same embodiment. In addition, the specific features, structures or characteristics in any specific embodiments may be combined with one or more other embodiments in any suitable manner.

Technical content and technical features of the present invention are disclosed above. However, a person skilled in the art may still make replacements and modifications based on the teachings and the disclosure of the present invention without departing from the spirit of the present invention. Therefore, the protection scope of the present invention should not be limited to the content disclosed in the embodiments, and should include various replacements and modifications without departing from the present invention, and is covered by the claims of this patent.

We claim:

1. A method for manufacturing an integrated circuit, comprising:
    obtaining measurement data according to a first group of overlay marks on a first wafer, wherein the first group of overlay marks are disposed in a first region on the first wafer;
    obtaining a first parameter set according to a first model and the measurement data; and
    projecting, using a processor, the first parameter set into a second region on a second wafer to obtain simulated compensation data, wherein the second region comprises a second group of overlay marks whose quantity is greater than that of the first group of overlay marks.

2. The method for manufacturing an integrated circuit according to claim 1, further comprising:
    dividing the first region on the first wafer into a first subregion and a second subregion;
    obtaining, according to the simulated compensation data and a second model, a second parameter set associated with the first subregion;
    obtaining, according to the simulated compensation data and the second model, a third parameter set associated with the second subregion;
    calibrating a stitching error between the first subregion and the second subregion according to the second parameter set and the third parameter set; and
    calibrating an overlay error of the first region on the first wafer according to the second parameter set and the third parameter set.

3. The method for manufacturing an integrated circuit according to claim 2, wherein the projecting the first parameter set into the second region on the second wafer to obtain the simulated compensation data comprises:
    projecting the first subregion on the first wafer into a third subregion on the second wafer; and
    projecting the second subregion on the first wafer into a fourth subregion on the second wafer.

4. The method for manufacturing an integrated circuit according to claim 3, wherein the first subregion on the first wafer and the third subregion on the second wafer have a same size, and the second subregion on the first wafer and the fourth subregion on the second wafer have a same size.

5. The method for manufacturing an integrated circuit according to claim 4, wherein
    the second wafer is a virtual wafer; and
    the second group of overlay marks comprises a first overlay mark disposed in the third subregion on the second wafer and a second overlay mark disposed in the fourth subregion on the second wafer.

6. The method for manufacturing an integrated circuit according to claim 3, wherein the second model and the first model are compatible, such that a residual between a first group of compensation data that is obtained according to the first model and is associated with the first subregion and a second group of compensation data that is obtained according to the second model and is associated with the third subregion is zero.

7. The method for manufacturing an integrated circuit according to claim 1, further comprising selecting a plurality of coordinates to obtain the second group of overlay marks on the second wafer.

8. The method for manufacturing an integrated circuit according to claim 1, wherein the first model is one of a wafer level model or a region level model.

9. The method for manufacturing an integrated circuit according to claim 1, wherein the measurement data indicates an offset amount associated with the first group of overlay marks.

10. The method for manufacturing an integrated circuit according to claim 1, wherein the first region on the first wafer and the second region on the second wafer have a same size.

11. The method for manufacturing an integrated circuit according to claim 1, wherein the second model is an intra-region model.

12. A method for manufacturing an integrated circuit, comprising:
    defining a first subregion and a second subregion in a first region on a first wafer, wherein a first group of overlay marks are disposed in the first region;
    applying a first model to measurement data associated with the first group of overlay marks to obtain a first parameter set; and
    projecting, using a processor, the first parameter set into a second region that is on a second wafer and has a same layout as the first region to obtain simulated compensation data.

13. The method for manufacturing an integrated circuit according to claim 12, further comprising:
    obtaining, according to the simulated compensation data and a second model, a second parameter set associated with the first subregion;
    obtaining, according to the simulated compensation data and the second model, a third parameter set associated with the second subregion; and
    calibrating a stitching error between the first subregion and the second subregion and an overlay error of the first region on the first wafer according to the second parameter set and the third parameter set.

14. The method for manufacturing an integrated circuit according to claim 12, wherein the second region comprises a second group of overlay marks, and a quantity of the second group of overlay marks is greater than that of the first group of overlay marks.

15. The method for manufacturing an integrated circuit according to claim 12, wherein the first model is one of a wafer level model or a region level model.

16. The method for manufacturing an integrated circuit according to claim 12, wherein the same layout indicates that the second region on the second wafer comprises a third subregion and a fourth subregion that respectively correspond to the first subregion and the second subregion on the first wafer, wherein the second model and the first model are compatible such that:

a residual between a first group of compensation data that is obtained according to the first model and is associated with the first subregion and a second group of compensation data that is obtained according to the second model and is associated with the third subregion is zero; and a residual between a third group of compensation data that is obtained according to the first model and is associated with the second subregion and a fourth group of compensation data that is obtained according to the second model and is associated with the fourth subregion is zero.

17. The method for manufacturing an integrated circuit according to claim 16, wherein the first subregion and the third subregion have a same size; and the second subregion and the fourth subregion have a same size.

18. The method for manufacturing an integrated circuit according to claim 17, wherein the second group of overlay marks comprises a first overlay mark disposed in the third subregion on the second wafer and a second overlay mark disposed in the fourth subregion on the second wafer.

19. A system for manufacturing an integrated circuit configured to perform the method of claim 12, wherein the system includes the processor, a non-transitory computer-readable medium storing computer executable instructions that is coupled to the processor; and a handler configured to support the first wafer.

20. A system for manufacturing an integrated circuit, comprising:

a processor;

a non-transitory computer-readable medium, storing computer executable instructions, and coupled to the processor; and a handler configured to support a first wafer, wherein the processor is capable of executing the computer executable instructions to:

obtain measurement data according to a first group of overlay marks on the first wafer, wherein the first group of overlay marks are disposed in a first region on the first wafer;

obtain a first parameter set according to a first model and the measurement data; and project the first parameter set into a second region on a second wafer to obtain simulated compensation data, wherein the second region comprises a second group of overlay marks whose quantity is greater than that of the first group of overlay marks.

* * * * *